(12) United States Patent
Kim

(10) Patent No.: US 6,849,532 B2
(45) Date of Patent: Feb. 1, 2005

(54) METHOD OF MANUFACTURING A TRANSISTOR IN A SEMICONDUCTOR DEVICE

(75) Inventor: Hyung Sik Kim, Chungceongbuk-Do (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 45 days.

(21) Appl. No.: 10/285,697

(22) Filed: Nov. 1, 2002

(65) Prior Publication Data

US 2003/0124826 A1 Jul. 3, 2003

(30) Foreign Application Priority Data

Dec. 29, 2001 (KR) ........................................ 2001-87991

(51) Int. Cl.$^7$ .................... H01L 21/3205; H01L 21/336
(52) U.S. Cl. ...................... 438/592; 438/585; 438/305; 438/302; 438/289
(58) Field of Search ................. 438/592, 585, 438/305, 302, 289, 291, 197, 182

(56) References Cited

U.S. PATENT DOCUMENTS

| | | | | |
|---|---|---|---|---|
| 5,180,689 A | * | 1/1993 | Liu et al. ..................... | 156/653 |
| 5,712,501 A | * | 1/1998 | Davis et al. ................. | 257/335 |
| 5,766,998 A | * | 6/1998 | Tseng .......................... | 438/291 |
| 6,069,387 A | | 5/2000 | Gardner ....................... | 257/344 |
| 6,077,733 A | * | 6/2000 | Chen et al. .................. | 438/197 |
| 6,159,781 A | * | 12/2000 | Pan et al. .................... | 438/182 |
| 6,326,290 B1 | | 12/2001 | Chiu ........................... | 438/592 |
| 6,337,262 B1 | * | 1/2002 | Pradeep et al. ............. | 438/595 |
| 6,355,955 B1 | | 3/2002 | Gardner et al. ............. | 257/330 |
| 6,423,587 B1 | * | 7/2002 | Chen ........................... | 438/182 |

\* cited by examiner

Primary Examiner—Michael Trinh
(74) Attorney, Agent, or Firm—Piper Rudnick LLP

(57) ABSTRACT

The present invention relates to a method of manufacturing a transistor in a semiconductor device. In order to increase an upper area of a gate electrode in which a silicide layer will be formed, an upper portion of the gate electrode consisting of the polysilicon layer is formed to be wider than a lower portion while maintaining the channel length. Therefore, a sheet resistance characteristic of the silicide layer and the uniformity of the sheet resistance can be improved to this improve an electrical characteristic of a device.

10 Claims, 6 Drawing Sheets

METHOD OF MANUFACTURING A TRANSISTOR IN A SEMICONDUCTOR DEVICE

BACKGROUND OF THE INVENTION

1. Field of the Invention

The invention relates generally to a method of manufacturing a transistor in a semiconductor device, and more particularly to, a method of manufacturing a transistor in a semiconductor device capable of improving a sheet resistance characteristic of a silicide layer formed on a gate electrode and the uniformity of the sheet resistance.

2. Description of the Prior Art

FIG. 1A through FIG. 1E are cross-sectional views of semiconductor devices for describing a method of manufacturing a transistor in the semiconductor device according to a prior art.

Referring now to FIG. 1A, a device isolation film 12 is formed at a device isolation region of a semiconductor substrate 11.

By reference to FIG. 1B, an ion implantation mask 13, by which a region where a device will be formed is opened, is formed. A well 14 is then formed at an exposed region of the semiconductor substrate 11 by means of an ion implantation process.

Referring now to FIG. 1C, a gate oxide film 15 and a polysilicon layer 16 are sequentially formed to have a given pattern on the well 14 by means of an oxidization process and deposition process. Next, a first LDD ion implantation layer 17 for forming a source/drain is formed by means of a low-concentration ion implantation process.

By reference to FIG. 1D, an impurity is injected into a lower region of edges of the LDD ion implantation layer 17 and the polysilicon layer 16 by means of the low-concentration ion implantation process having a given incident angle, thus forming a second LDD ion implantation layer 18.

Referring to FIG. 1E, a buffer oxide film 19 is formed at the sidewall of the polysilicon layer 16. Next, after an insulating film is formed on the entire structure, an insulating film spacer 20 is formed at the sidewalls of the gate oxide film 15 and the polysilicon layer 16 by means of an etch process. At this time, the insulating film on the polysilicon layer 16 and the first LDD ion implantation layer 17 is removed by the blanket etch process.

Thereafter, a high-concentration ion implantation layer 21, which is deeper than the first LDD ion implantation layer 17, is formed by means of a high-concentration ion implantation process using the polysilicon layer 17 and the insulating film spacer 20 as an ion implantation mask. Next, a source/drain 22 consisting of the high-concentration ion implantation layer 21 and the first and second LDD ion implantation layers 17 and 18 is formed by an activation annealing process. After a silicide layer 23 is formed on the source/drain 22 in order to reduce the contact resistance, the ion implantation mask 13 is removed. Thereby, a transistor is manufactured.

Generally, in a process of manufacturing a transistor having a design rule of below 0.2 μm the silicide layer 23 is formed using cobalt (Co). At this time, in case of forming the silicide layer 23 on a single crystal silicon substrate using Co like the source/drain 22, it is possible to secure a thermal stability even at a high temperature annealing process of over 850° C. On the contrary, in case of forming the silicide layer 23 on the polysilicon layer 16 using Co like the gate electrode, the silicide layer 23 is agglomerated and the grain of the polysilicon layer 16 is grown. Due to this, the sheet resistance (Rs) of the suicide layer 23 is degraded even in an annealing process of over 700° C. due to the line width of the gate electrode consisting of the polysilicon layer 16. In particular, there is a problem that the uniformity of the sheet resistance (Rs) is degraded depending on the region of the wafer. This problem further occurs when the grain of the polysilicon layer 16 is small.

SUMMARY OF THE INVENTION

The present invention is contrived to solve the above problems and an object of the present invention is to provide a method of manufacturing a transistor in a semiconductor device capable of improving a sheet resistance characteristic of a silicide layer and the uniformity of the sheet resistance, in a way that an upper portion of a gate electrode is formed to be wider than a lower portion of the gate electrode while maintaining the length of a channel in order to increase the area of the upper portion of the gate electrode in which the silicide layer will be formed.

In order to accomplish the above object, a method of manufacturing a transistor in a semiconductor device comprises the steps of forming an insulating film on a semiconductor substrate; forming a trench at the insulating film of a region in which a gate electrode will be formed by means of an etch process, wherein an upper portion of the trench is wider than a lower portion thereof; forming an insulating film spacer on the sidewall of the trench; forming a gate oxide film on the semiconductor substrate of the bottom of the trench; forming the gate electrode in the trench; removing the insulating film; forming a source/drain; and forming a silicide layer on the gate electrode and the source/drain.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
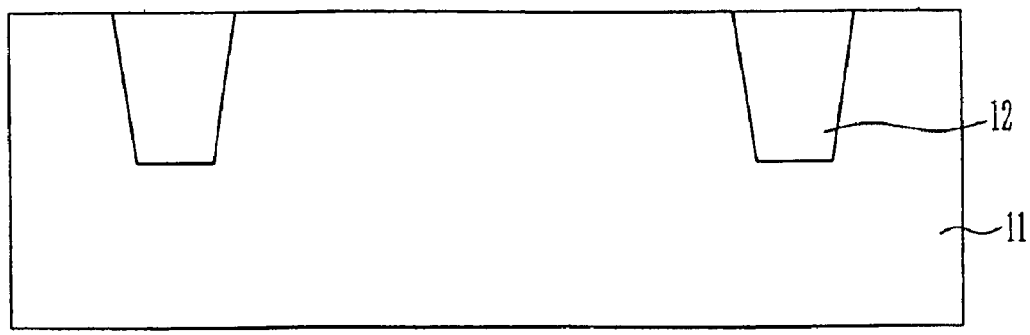
FIG. 1A through FIG. 1E are cross-sectional views of semiconductor devices for describing a method of manufacturing a transistor in the semiconductor device according to a prior art.
Figure 1B:
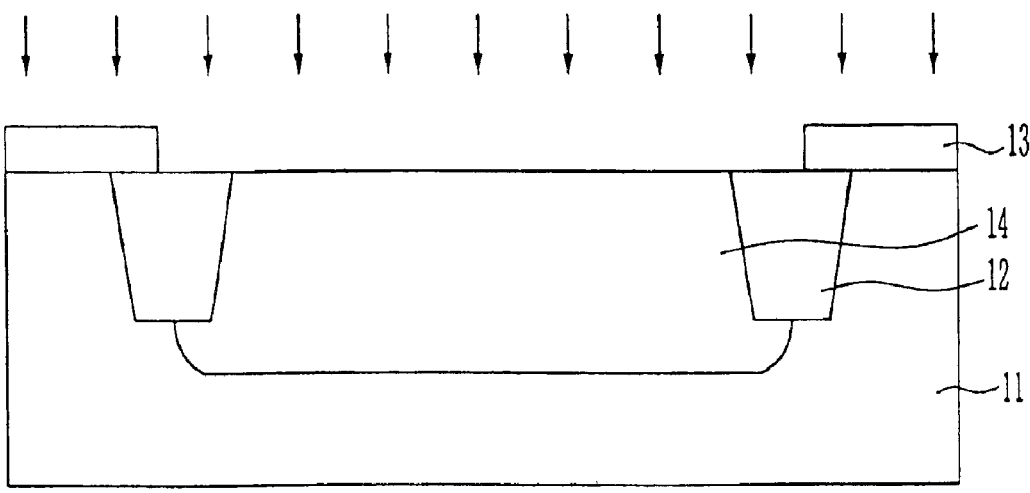
Figure 1C:
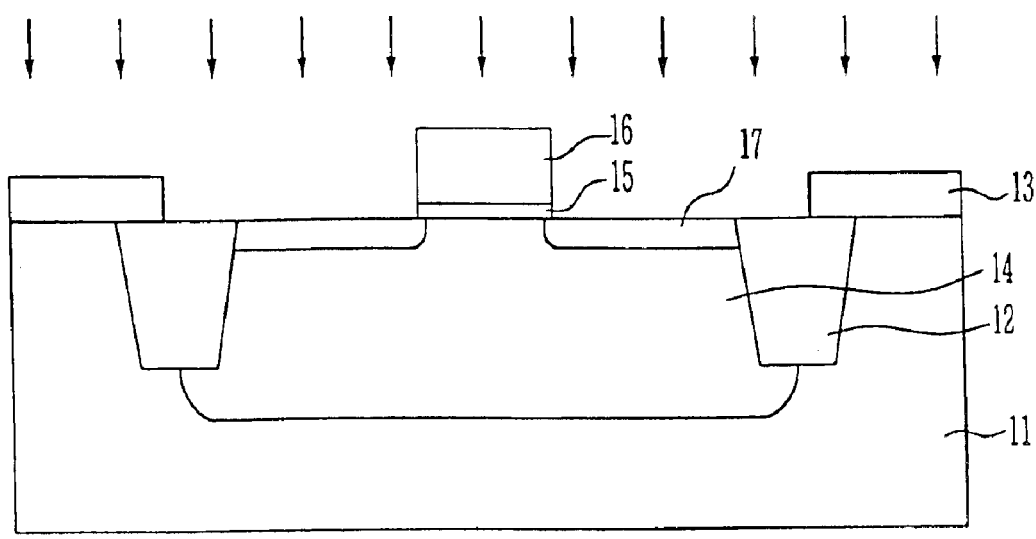
Figure 1D:
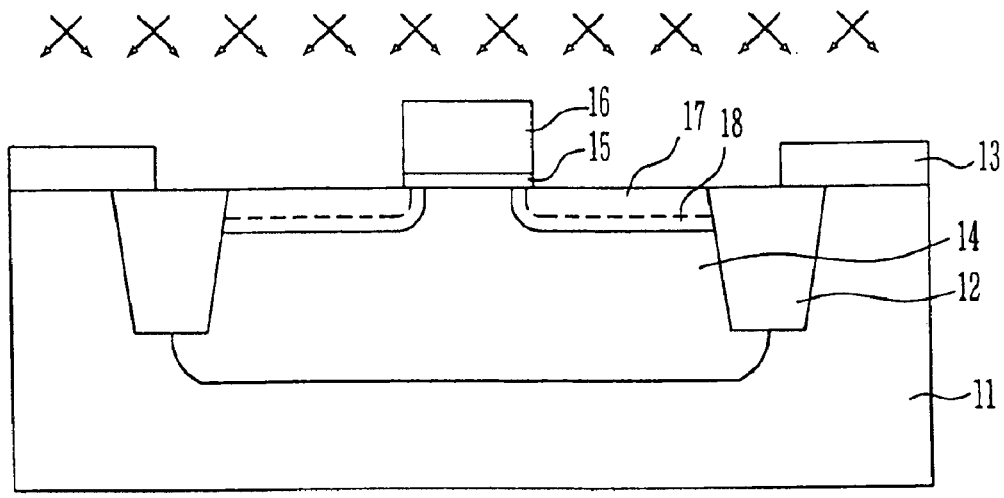
Figure 1E:
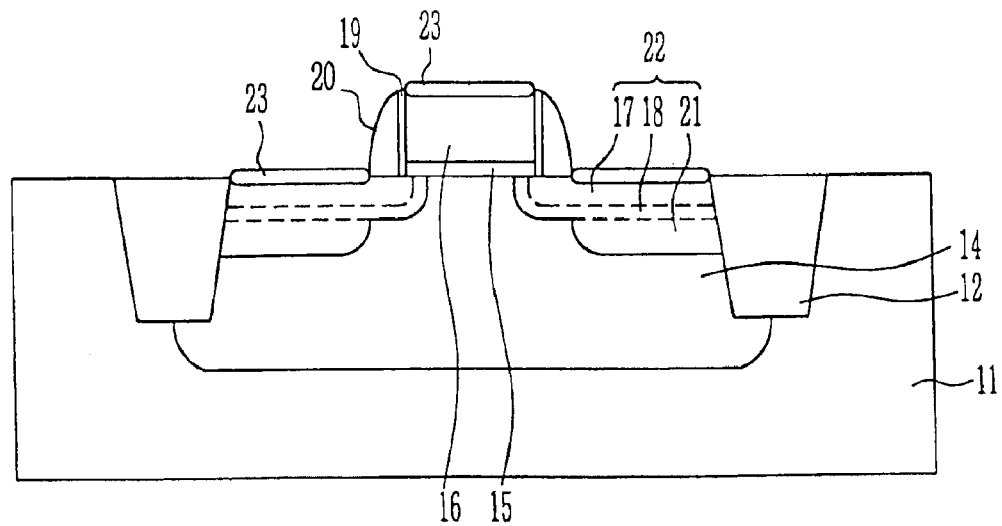

The present invention will be described in detail by way of a preferred embodiment with reference to accompanying drawings, in which like reference numerals are used to identify the same or similar parts.

FIG. 2A through FIG. 2I are cross-sectional views of semiconductor devices for describing a method of manufacturing a transistor in a semiconductor device according to the present invention.

Figure 2A:
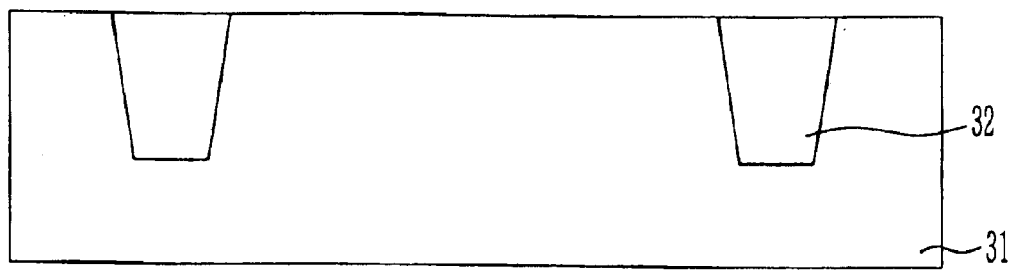
FIG. 2A through FIG. 2I are cross-sectional views of semiconductor devices for describing a method of manufacturing a transistor in a semiconductor device according to the present invention.

Referring now to FIG. FIG. 2A, a device isolation film 32 is formed at a device isolation region of a semiconductor substrate 31.

Figure 2B:
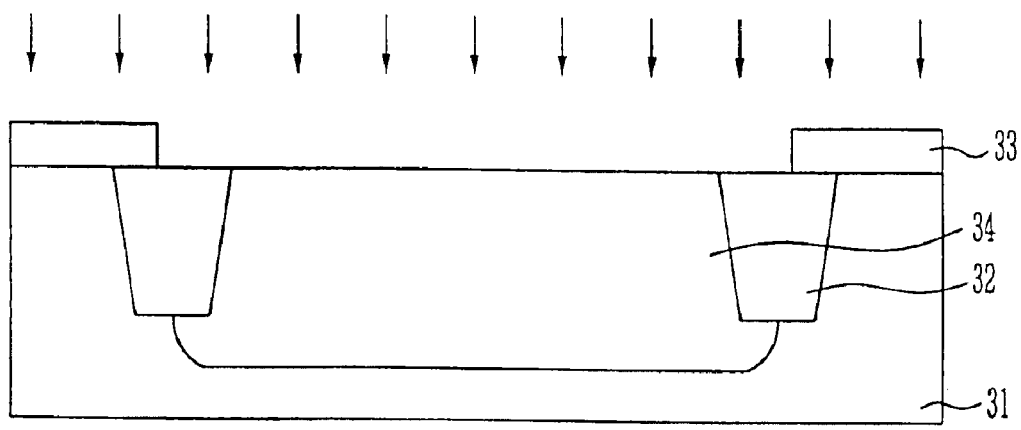

By reference to FIG. 2B, a first ion implantation mask 33, by which a region where a device will be formed is opened, is formed. A well 34 is then formed at an exposed region of the semiconductor substrate 31 by means of an ion implantation process.

Figure 2C:
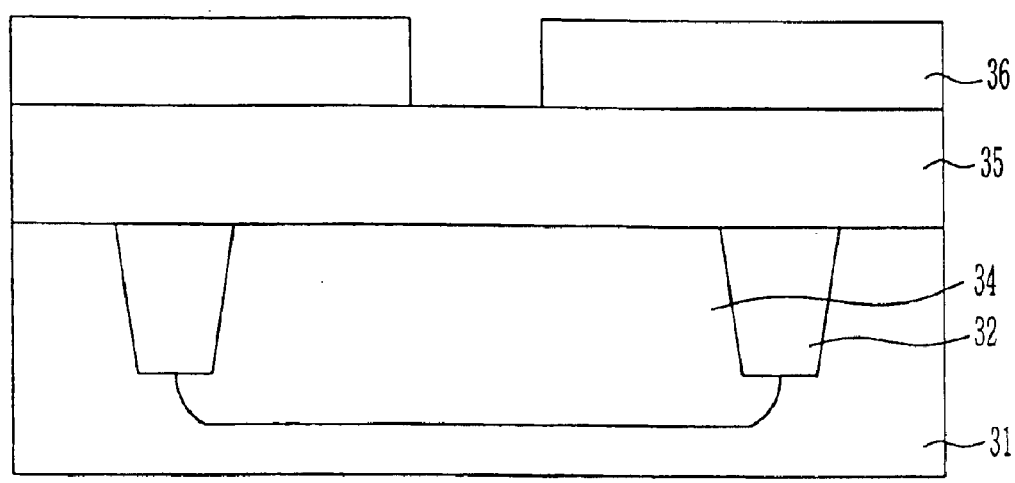

Referring now to FIG. 2C, after the first ion implantation mask is removed, an insulating film 35 is formed on the entire structure. A gate mask 36 is then formed on the insulating film 35. Next, only the insulating film 35 at a region in which a gate electrode will be formed is exposed. At this time, the insulating film 35 is formed in thickness of 2500 through 4000 Å by means of a chemical vapor deposition (CVD) method.

Figure 2D:
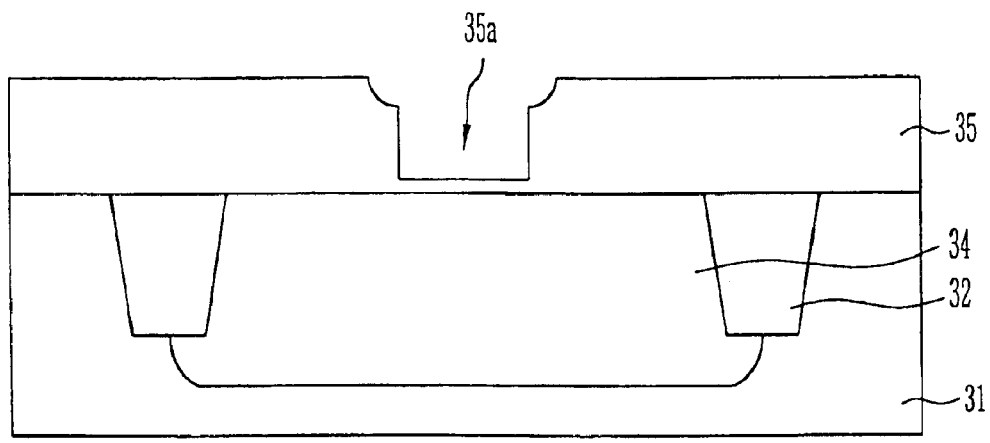

Referring now to FIG. 2D, the insulating film 35 exposed through the gate mask 36 is removed by an etch process, thus forming a trench 35a at the insulating film 35 of a region in which a gate electrode will be formed. At this time, the insulating film 35 of the region in which the gate electrode will be formed remains in thickness of 100 through 200 Å in order to prevent generation of etch damage on the surface of the semiconductor substrate 31.

Meanwhile, upon the etch process, two-step etch processes of a wet etch process having an isotropic etch characteristic and a dry etch process having an anisotropic etch characteristic are performed to etch the insulating film 35 at the edge of an upper portion of the trench 35a. At this time, upon the wet etch process, the insulating film 35 is removed in thickness of 800 through 1200 Å. On the other hand, upon the dry etch process, the insulating film 35 at the region in which the gate electrode will be formed remains in thickness of 100 through 200 Å. The gate mask is then removed.

Figure 2E:
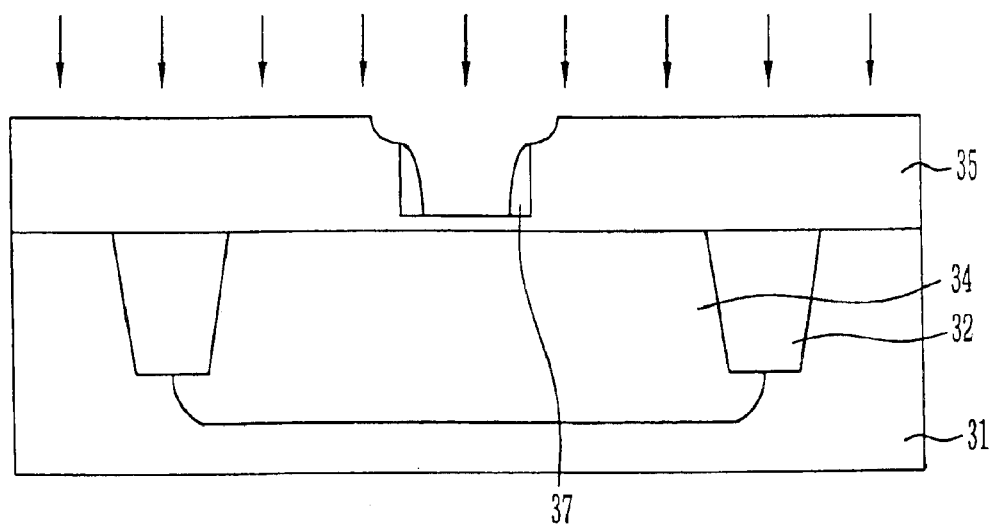

Referring now to FIG. 2E, a nitride film or an oxide film is formed on the entire structure. A blanket etch process is then performed to form an insulating film spacer 37 at the sidewall of the trench 35a. At this time, the insulating film spacer 37 is formed only at the sidewall of the trench 35a except for the region from which the upper edge is removed. Due to this, the upper portion of the trench 35a is wider than the lower portion of the trench 35a, and the difference between the upper portion and lower portion of the trench 35a becomes also 1000 through 2000 Å.

In the above, the nitride film or the oxide film is formed in thickness of 500 through 1000 Å by means of a low-pressure chemical vapor deposition (LPCVD) method. Next, in order to cure etch damage due to the etch process and to protect the surface upon the threshold voltage ion implantation process, a thermal oxide film (not shown) having a thickness of 50 through 150 Å is formed at a temperature of 700 through 900° C. Thereafter, the threshold voltage ion implantation process for controlling the threshold voltage of the transistor is performed.

Figure 2F:
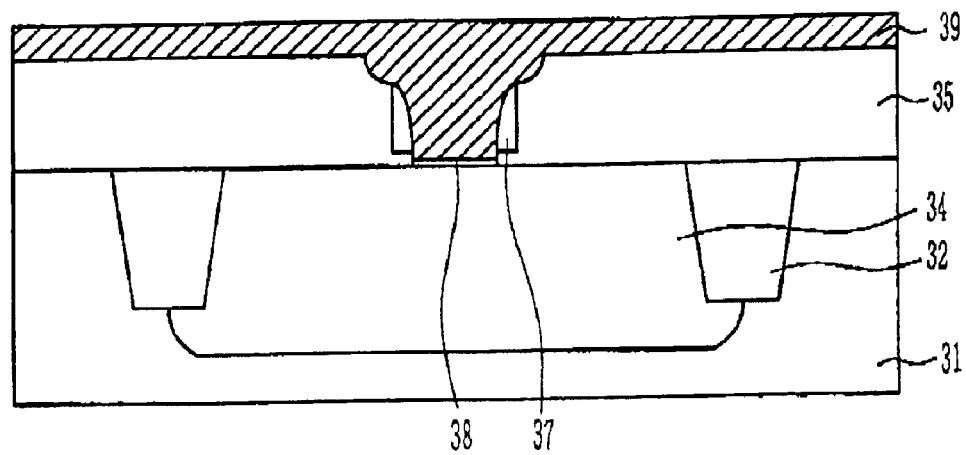

Referring now to FIG. 2F, the insulating film 35 remaining on the lower portion of the trench 35a is removed by the wet etch process using a solution of HF series. A gate oxide film 38 is then formed on the exposed surface of the semiconductor substrate 31. Next, a polysilicon layer 39 is formed on the entire structure so that the trench 35a is completely buried.

In the above, the gate oxide film 38 is formed in thickness of 15 through 100 Å at a temperature of 700 through 900° C. The polysilicon layer 39 is also formed in thickness of 2000 through 4000 Å by means of the LPCVD method at a temperature of 500 through 750° C.

Figure 2G:
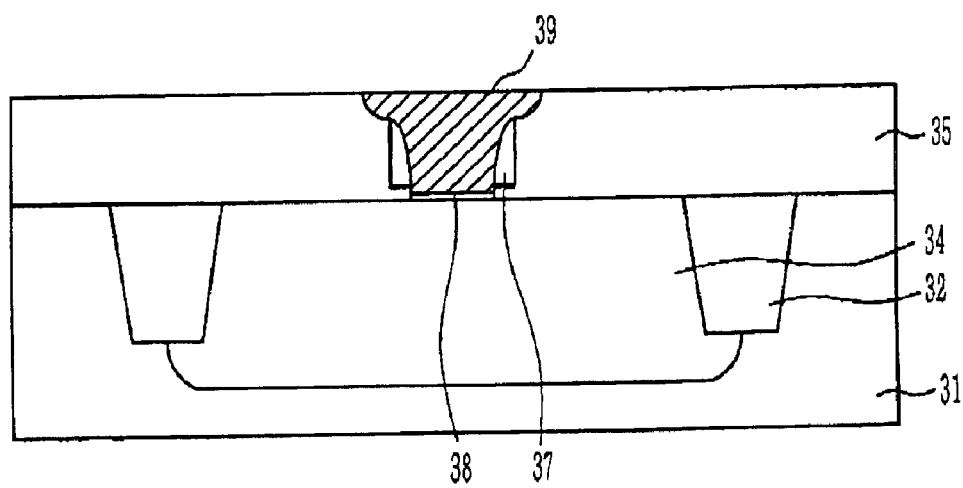

Referring now to FIG. 2G, the polysilicon layer 39 on the insulating film 35 is removed by an etch process without a mask or a chemical mechanical polishing process. The polysilicon layer 39 thus remains only at the trench 35a.

The upper portion of the polysilicon layer 39 remained at the trench 35a is wider than the lower portion of the polysilicon layer 39, like the trench 35a. Therefore, the difference between the upper width and the lower width of the polysilicon layer 39 becomes 1000 through 2000 Å.

Thereby, the gate electrode having the polysilicon layer 39 the upper portion of which is wider than the lower portion is formed.

Figure 2H:
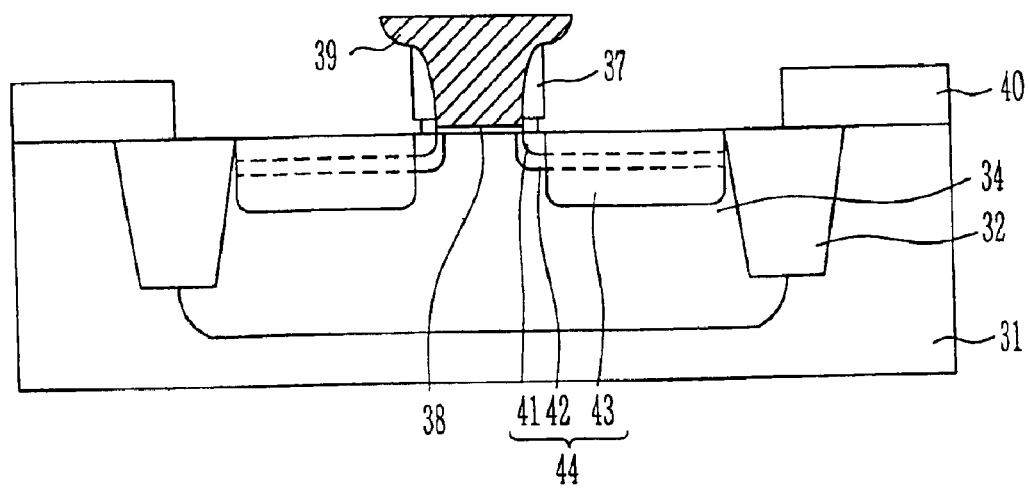

Referring now to FIG. 2H, the insulating film is removed. After a second ion implantation mask 40 is formed, a first LDD ion implantation layer 41 for forming a source/drain is formed by means of a low-concentration ion implantation process. An impurity is then injected into a lower region of edges of the first LDD ion implantation layer 41 and the insulating film spacer 37 by means of a low-concentration ion implantation process having a given incident angle, thus forming a second LDD ion implantation layer 42. Further, a high-concentration ion implantation layer 43 deeper than the first LDD ion implantation layer 41 is formed by means of a high-concentration ion implantation process. Next, a source/drain 44 consisting the high-concentration ion implantation layer 43 and the first and second LDD ion implantation layers 41 and 42 is formed by means of an activation annealing process.

In the above, as the first and second LDD ion implantation layers 41 and 42 are formed to have a low concentration and a shallow deep, it is possible to prevent a problem that a hot carrier effect generated as the size of a device is reduced occurs. It is further possible to reduce a phenomenon that an electric field is locally concentrated. In addition, the distance between the source and the drain becomes narrow as the length (channel length) of the gate is reduced. Due to this, it is possible to solve a problem that a shot channel effect by which the threshold voltage of a device is lowered occurs.

Figure 2I:
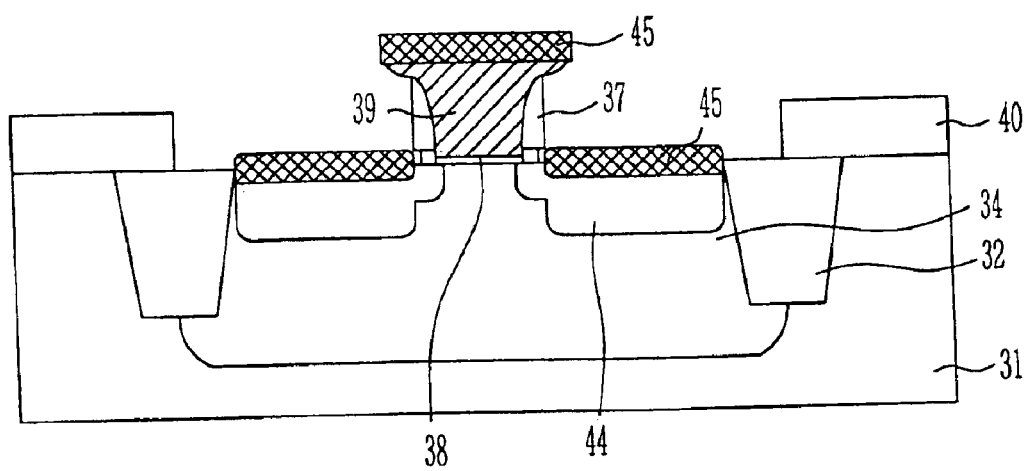

Referring now to FIG. 2I, after the second ion implantation mask 40 is formed, a suicide layer 45 is formed on the polysilicon layer 39 and the source/drain 44, in order to lower the contact resistance.

At this time, the silicide layer 45 is formed by the processes of depositing a metal material such as cobalt (Co) on the entire structure, performing a first annealing process, removing non-reacted metal material and then performing a second annealing process.

Further, Co is deposited in thickness of 50 through 150 Å. Next, the first annealing process by which the polysilicon layer 39 and the source/drain 44 react with Co to form the silicide layer 45 is performed under nitrogen atmosphere at a temperature of 350 through 600° C. for 30 through 90 seconds.

Co that does not react at the regions except for the upper portion of the polysilicon layer 39 and the source and drain 44 is removed by performing first wet etch using a mixed solution of $NH_4OH$, $H_2O_2$ and $H_2O$ and then performing second wet etch using a mixed solution of HCl, $H_2O_2$ and $H_2O$.

Thereafter, the second annealing process for improving the film quality of the suicide layer 45 is performed under nitrogen atmosphere at a temperature of 700 through 850° C. for 20 through 40 seconds.

In the above, the first and second annealing processes are performed in the rapid annealing process equipment.

In order to improve the stability of the process, the step of forming the silicide layer 45 may include forming a capping layer (not shown) of Ti or TiN on an upper portion of Co before Co is deposited and the first annealing process is performed. At this time, in case of forming the capping layer using Ti, Ti is formed in thickness of 80 through 150 Å. On the other hand, in case of forming the capping layer using TiN, TiN is formed in thickness of 150 through 300 Å.

The silicide layer 45 formed in the above is formed on the polysilicon layer 39 having a wider area than the conventional polysilicon layer. Thus, a more stable and uniform resistance characteristic can be obtained. Further, the length of the channel can be adjusting by controlling the thickness of the insulating film spacer 37. Due to this, a good silicide layer 45 can be obtained without degrading the characteristic of the silicide layer 45 and without addition process for improving the characteristic. In addition, a method of manufacturing a transistor having a shorter channel length and a narrow line width can be performed using an existing equipment.

As mentioned above, according to the present invention, in a method of forming a gate electrode of a trench type by which the trench is formed and a conductive material is buried into the trench to form the gate electrode, an upper edge of the trench is etched to form the gate electrode an upper portion of which is wider than a lower portion thereof upon an etch process of forming the trench. Therefore, the present invention has outstanding advantages that a sheet resistance characteristic of a suicide layer formed on the gate electrode and the uniformity of the sheet resistance can be improved since a region in which the silicide layer will be formed is secured by maximum while maintaining the length of a channel.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a transistor in a semiconductor device, comprising the steps of:
   forming an insulating film on a semiconductor substrate;
   forming a trench at the insulating film of a region in which a gate electrode will be formed by means of an etch process;
   etching an upper portion of the trench so that the upper portion is wider than a lower portion thereof;
   forming an insulating film spacer on sidewalls of the lower portion of the trench;
   forming a gate oxide film on the semiconductor substrate in the bottom of the trench;
   forming the gate electrode on the gate oxide film and on the insulating film spacer to fill the upper and lower portions of the trench, wherein a width of an upper portion of the gate electrode is wider than a combined width of a lower portion of the gate electrode and the insulating film spacer;
   removing the insulating film;
   forming a source/drain in the semiconductor substrate; and
   forming a suicide layer on the gate electrode and the source/drain.

2. The method as claimed in claim 1, wherein the insulating film is formed in thickness of 2500 through 4000 Å by means of a chemical vapor deposition method.

3. The method as claimed in claim 1, wherein the etch process includes two-step etch processes of a wet etch process having an isotropic etch characteristic and a dry etch process having an anisotropic etch characteristic.

4. The method as claimed in claim 3, wherein upon the wet etch process, the insulating film is removed in thickness of 800 through 1200 Å, and upon the dry etch process, the insulating film remains in thickness of 100 through 200 Å, so that etch damage generating on the surface of the semiconductor substrate is prevented.

5. The method as claimed in claim 4, wherein, the remained insulating film is removed by means of a wet etch process using a solution of HF series before a gate oxide film is formed.

6. The method as claimed in claim 1, wherein the width of an upper portion of the trench is wider by 1000 through 2000 Å than the width of a lower portion of the trench.

7. The method as claimed in claim 1, wherein the insulating film spacer is formed by forming a nitride film or an oxide film in thickness of 500 through 1000 Å by means of a low-pressure chemical vapor deposition method and then performing a blanket etch process.

8. The method as claimed in claim 1, further comprising the step of after the insulating film spacer is formed, forming a thermal oxide film having a thickness of 50 through 150 Å at a temperature of 700 through 900° C. and then performing a threshold voltage ion implantation process for controlling the threshold voltage of a transistor.

9. The method as claimed in claim 1, wherein the gate oxide film is formed in thickness of 15 through 100 Å at a temperature of 700 through 900° C.

10. The method as claimed in claim 1, wherein a method of forming the source/drain comprises:
   forming a first LDD ion implantation layer by means of a low-concentration ion implantation process;
   forming a second LDD ion implantation layer by means of a low-concentration ion implantation process having a given incident angle; and
   forming a high-concentration ion implantation layer by means of a high-concentration ion implantation process.

* * * * *